United States Patent
Oddicini et al.

(10) Patent No.: US 11,411,500 B2
(45) Date of Patent: Aug. 9, 2022

(54) VOLTAGE FEEDBACK CONTINUITY FAILURE DETECTION IN VOLTAGE REGULATORS

(71) Applicant: Infineon Technologies Austria AG, Villach (AT)

(72) Inventors: Mattia Oddicini, Redondo Beach, CA (US); Kelsey Curtis, San Diego, CA (US); Tim Ng, Monterey Park, CA (US); Cha-Fu Tsai, Torrance, CA (US)

(73) Assignee: Infineon Technologies Austria AG, Villach (AT)

( * ) Notice: Subject to any disclaimer, the term of this patent is extended or adjusted under 35 U.S.C. 154(b) by 50 days.

(21) Appl. No.: 16/680,957

(22) Filed: Nov. 12, 2019

(65) Prior Publication Data
US 2021/0143740 A1    May 13, 2021

(51) Int. Cl.
*H02M 3/335*    (2006.01)
*H02M 3/156*    (2006.01)

(52) U.S. Cl.
CPC ....... *H02M 3/33507* (2013.01); *H02M 3/156* (2013.01)

(58) Field of Classification Search
None
See application file for complete search history.

(56) References Cited

U.S. PATENT DOCUMENTS

| | | | | |
|---|---|---|---|---|
| 4,355,277 | A * | 10/1982 | Davis | H02M 3/156 323/351 |
| 10,310,528 | B1 * | 6/2019 | Elsayed | G05F 3/30 |
| 2003/0062931 | A1 * | 4/2003 | Carsten | H02M 3/1588 327/108 |
| 2004/0150928 | A1 | 8/2004 | Goodfellow et al. | |
| 2015/0171879 | A1 * | 6/2015 | Kimura | H01L 23/528 341/118 |
| 2017/0089969 | A1 | 3/2017 | Igarashi et al. | |
| 2017/0205458 | A1 | 7/2017 | Kurooka et al. | |
| 2018/0267092 | A1 * | 9/2018 | Kurooka | G01R 31/50 |

* cited by examiner

*Primary Examiner* — Jeffrey A Gblende
(74) *Attorney, Agent, or Firm* — Murphy, Bilak & Homiller, PLLC (57) ABSTRACT

A controller for a power converter includes: a first sense terminal and a second sense terminal for sensing an output voltage of the power converter; a bridging circuit configured to electrically couple the first sense terminal to the second sense terminal in a first state and electrically decouple the first sense terminal from the second sense terminal in a second state; and control circuitry configured to set the bridging circuit in the first state during a portion of a voltage ramp of the power converter, and to determine whether an open or short fault condition is present at either the first sense terminal or the second sense terminal based on a voltage across the bridging circuit in the first state.

22 Claims, 8 Drawing Sheets

| VSENP (state) | Open | Open | Open | Short (Gnd) | Short (Gnd) | Short (Gnd) | VSENP | VSENP | VSENP |
|---|---|---|---|---|---|---|---|---|---|
| VSENN (state) | Open | Gnd | Short (Gnd) | Open | Gnd | Short (Gnd) | Open | Gnd | Short (Gnd) |
| VSENP-VSENN (V) | 0 | $\frac{2}{\sqrt{2}} \times V \tau h$ | $\frac{2}{\sqrt{2}} \times V \tau h$ | $\frac{2}{\sqrt{2}} \times V \tau h$ | 0 | 0 | $\frac{2}{\sqrt{2}} \times V semp$ | VSENP | VSENP |
| OSP Detection | Fault | Fault | Fault | Fault | Fault | Fault | Fault | OK | OK |

VOLTAGE FEEDBACK CONTINUITY FAILURE DETECTION IN VOLTAGE REGULATORS

BACKGROUND

Voltage regulators typically have a feedback path for sensing the voltage close to the regulation loop. If an open or short continuity defect occurs on the feedback path, catastrophic failure may occur. Most voltage regulators implement overvoltage/undervoltage, over current, and over temperature protection as the primary means of protecting the regulator in the event of component failure or faulty manufacturing. Open or short faults on the feedback path for sensing the regulator output voltage are typically detected as a combination of other fault types, such as overtemperature and/or overvoltage. However, this approach in general does not guarantee reliable detection of all open and short fault conditions on the voltage sense feedback path.

Thus, there is a need for improved voltage feedback continuity failure detection in voltage regulators.

SUMMARY

According to an embodiment of a controller for a power converter, the controller comprises: a first sense terminal and a second sense terminal for sensing an output voltage of the power converter; a bridging circuit configured to electrically couple the first sense terminal to the second sense terminal in a first state and electrically decouple the first sense terminal from the second sense terminal in a second state; and control circuitry configured to set the bridging circuit in the first state during a portion of a voltage ramp of the power converter, and to determine whether an open or short fault condition is present at either the first sense terminal or the second sense terminal based on a voltage across the bridging circuit in the first state.

According to an embodiment of a method of operating a controller for a power converter, the method comprises: sensing, across a first sense terminal and a second sense terminal of the controller, an output voltage of the power converter; setting a bridging circuit of the controller in a first state during a portion of a voltage ramp of the power converter, to electrically couple the first sense terminal to the second sense terminal; setting the bridging circuit in a second state during a later portion of the voltage ramp, to electrically decouple the first sense terminal from the second sense terminal; and determining whether an open or short fault condition is present at either the first sense terminal or the second sense terminal based on the voltage across the bridging circuit in the first state.

According to an embodiment of an electronic system, the electronic system comprises: a microprocessor; memory coupled to the microprocessor; a power converter configured to regulate a supply voltage of the microprocessor; and a controller for the power converter, the controller comprising: a first sense terminal and a second sense terminal for sensing the supply voltage; a bridging circuit configured to electrically couple the first sense terminal to the second sense terminal in a first state and electrically decouple the first sense terminal from the second sense terminal in a second state; and control circuitry configured to set the bridging circuit in the first state during a portion of a voltage ramp of the power converter, and to determine whether an open or short fault condition is present at either the first sense terminal or the second sense terminal based on a voltage across the bridging circuit in the first state.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described provide a voltage feedback continuity failure detection technique for power converters. The voltage feedback continuity failure detection technique includes monitoring the voltage feedback line of a power converter to detect a continuity failure such as an open or short circuit. The voltage feedback continuity failure detection technique described herein allows for prompt shutdown of a power converter so as to avoid damage, and reporting of the actual root cause of the problem.

The term "power converter" as used herein broadly refers to any type of power converter or voltage regulator (VR) that provides one or more regulated voltages to one or more electronic loads such as an Ethernet switch, an ASIC (application-specification integrated circuit), a memory device, a processor such as a central processing unit (CPU), microprocessor, graphics processing unit (GPU), digital signal processor (DSP), artificial intelligence (AI) accelerator, image processor, network or packet processor, coprocessor, multi-core processor, front-end processor, baseband processor, etc. For example, the power converter may be a buck converter, a boost converter, a buck-boost converter, a switched capacitor voltage regulator, a step-down converter, etc. The power converter may be implemented as a power device module.

The term "power device module" as used herein means a packaged functional assembly that includes at least one power switch of a power stage used in converting a voltage from one level to another level, e.g., as is done in power conversion and voltage regulation. The power device module may also include a driver circuit for driving the at least one power switch. The power device module may additionally include a controller for controlling the driver circuit so as to implement the power converter. The controller and/or driver functionality may instead be implemented outside the power device module. The driver circuit for the at least one power switch included in the power device module also may be outside the power device module. Various passive components such as capacitors and/or inductors that make up the power converter may be included in the power device module, surface mounted to the power device module, located on a separate board, etc. Described next in more detail are various embodiments of the power converter, a method of controlling the power converter, and an electronic system that includes the power converter.

Figure 1:
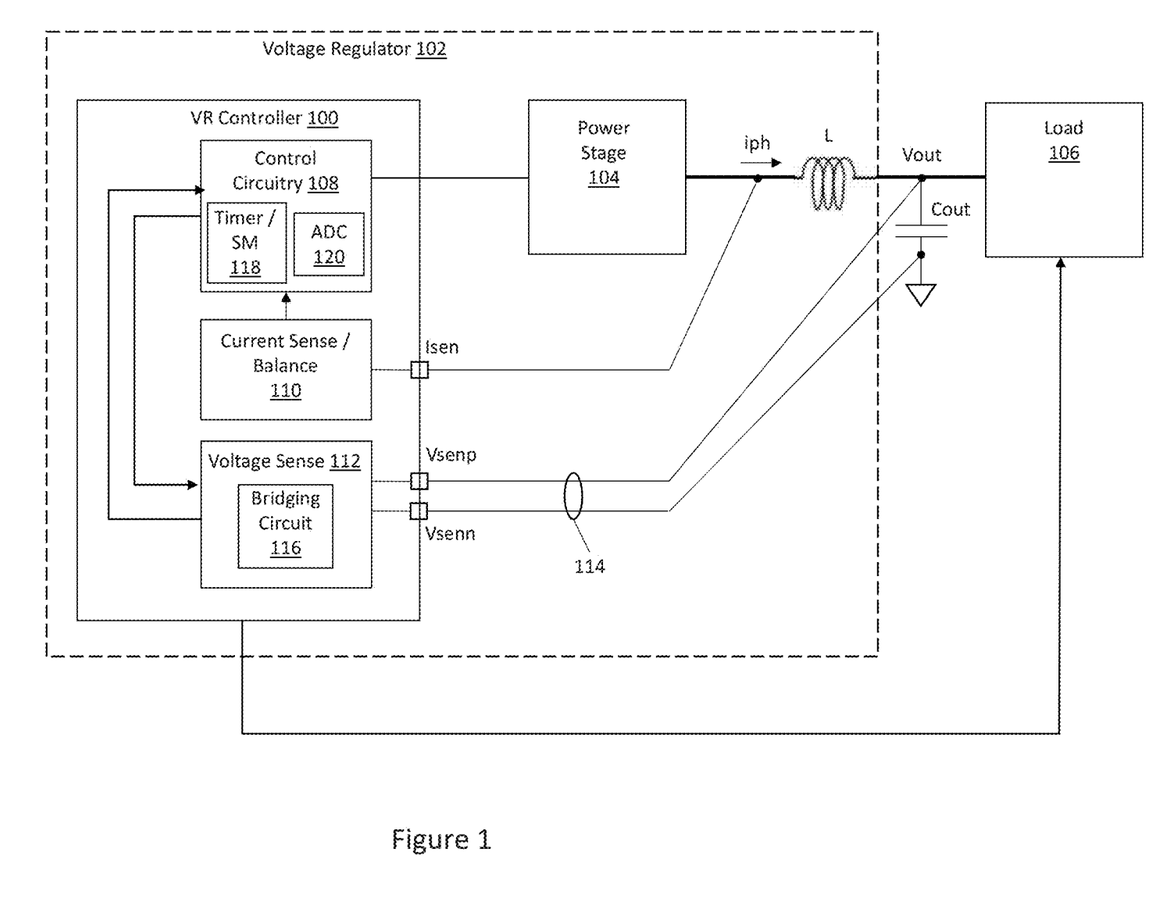
FIG. 1 illustrates a block diagram of an embodiment of a controller for a power converter.

FIG. 1 illustrates an embodiment of a controller 100 for a power converter (VR) 102. The VR controller 100 may be implemented as an analog controller or a digital controller. The power converter 102, which is shown as a buck converter for ease of illustration, includes one or more power stages 104 coupled to a load 106. For example, the power converter 102 may include a single power stage 104 in the case of a single-phase implementation or more than one power stage 104 in the case of a multi-phase implementation. The VR controller 100 includes control circuitry 108 for controlling each power stage 104 included in the power converter 102, to regulate a supply voltage (Vout) of the load 106.

The load 106 powered by the power converter 102 may be a high-performance integrated circuit such as a microprocessor, graphics processor, network processor, etc. or other type of integrated circuit requiring voltage regulation such as a POL (point-of-load), memory, etc. The power converter 102 may provide one or more regulated supply voltages, depending on the configuration of the power converter 102 and the number of power stages/phases 104.

The controller 100 of the power converter 102 further includes a current sense and balance circuit 110 for sensing the phase current (Iph) delivered by each power stage 104 at a corresponding current sense terminal Isen of the VR controller 100, and converting the sensed current information into phase current information. The current sense and balance circuit 110 also converts the phase current information into adjustments to the duty cycle generated by the VR controller 100 for each individual power stage 104, to adjust the phase currents so they remain balanced in the case of multi-phase operation.

The VR controller 100 also includes a voltage sense circuit 112 for determining the error between the output voltage (Vout) and a target voltage (Vtgt). In the case of a digital controller, the voltage sense circuit 112 converts the error voltage into a digital representation provided to the control circuitry 108. Again in the case of a digital controller, the control circuitry 108 of the VR controller 100 may include a pulse width modulator (PWM) for switching each power stage 104. The control circuitry 108 of the VR controller 100 adjusts the duty cycle and/or switching frequency of each power stage 104 based on the current information provided by the current sense and balance circuit 110 and the voltage information provided by the voltage sense circuit 112, to maintain the desired regulation of the output voltage Vout. The control circuitry 108 of the VR controller 100 may implement further control features such as feed-forward control, for example.

The VR controller 100 has a first voltage sense terminal Vsenp and a second voltage sense terminal Vsenn for sensing the output voltage Vout of the power converter 102. The voltage sense terminals Vsenp, Vsenn of the VR controller 100 provide an interface to which corresponding voltage sensing lines 114 are connected. The first voltage sense terminal Vsenp of the VR controller 100 may be a positive sense terminal and the second voltage sense terminal Vsenn of the VR controller 100 may be a negative or reference (ground) sense terminal.

While the regulator output voltage Vout is shown as being sensed across output capacitor Cout, this is for ease of illustration and understanding only. The sensing lines 114 connected to the voltage sense terminals Vsenp, Vsenn of the VR controller 100 may not necessarily be connected directly to the output capacitor Cout as shown. For example, the voltage sensing lines 114 may be connected at one end to the respective voltage sense terminals Vsenp, Vsenn of the VR controller 100 and at the opposite end to I/O (input/output) circuitry of the power stage 104.

In general, the voltage sensing lines 114 connected to the voltage sense terminals Vsenp, Vsenn of the VR controller 100 carry a voltage which corresponds to the output voltage Vout of the power converter 102, so that the voltage sense circuit 112 can directly measure/sense the regulator output voltage Vout at the first and second voltage sense terminals Vsenp, Vsenn of the VR controller 100. The voltage sense terminals Vsenp, Vsenn of the VR controller 100 may be physically implemented as pins, connectors, terminal blocks, etc.

Included in or associated with the voltage sense circuit 112 of the VR controller 100 is a bridging circuit 116 which is used by the control circuitry 108 of the VR controller 100 to implement the voltage feedback continuity failure detection technique described herein. The bridging circuit 116 is configured to electrically couple the first voltage sense terminal Vsenp of the VR controller 100 to the second voltage sense terminal Vsenn of the VR controller 100 in a first state and electrically decouple the voltage sense terminals Vsenp, Vsenn in a second state.

The control circuitry 108 of the VR controller 100 sets the bridging circuit 116 in the first state during a portion of a voltage ramp of the power converter 102, and determines whether an open or short fault condition is present at either the first voltage sense terminal Vsenp of the VR controller 100 or the second voltage sense terminal Vsenn of the VR controller 100 based on the voltage across the bridging circuit 116 in the first state. The voltage across the bridging circuit 116 in the first state should rise above a threshold value within a defined time window if no fault conditions are present on the sensing lines 114 connected to the voltage sense terminals Vsenp, Vsenn of the VR controller 100.

If, however, a short or open fault is present on either one of the voltage sensing lines 114, the voltage across the bridging circuit 116 in the first state will not rise above the threshold value within the defined time window. The control circuitry 108 of the VR controller 100 detects this voltage condition as a fault and may shutdown the power converter 102 and/or report the fault condition, e.g., to the load 106.

If the control circuitry 108 of the VR controller 100 determines that the power converter output voltage Vout is ramping properly, the control circuitry 108 sets the bridging circuit 116 in the second state during a later portion of the voltage ramp so that the bridging circuit 116 is disabled and does not interfere with normal operation of the power converter 102. The bridging circuit 116 may be controlled this way every ramp-up of the regulated voltage Vout, to implement the voltage feedback continuity failure detection technique and determine whether an open or short fault condition is present at either voltage sense terminal Vsenp, Vsenn of the VR controller 100. For example, the power converter 102 may be powered/active but the load 106 is inactive, e.g., in a sleep mode. Under this condition, the power converter 102 provides little or no power to the load 106. When the load 106 resumes operation and requires a ramping up of the regulated voltage Vout, the voltage feedback continuity failure detection technique may be performed again by the control circuitry 108 of the VR controller 100.

If there is no fault present at either voltage sense terminal Vsenp, Vsenn of the VR controller 100, current should flow through the bridging circuit 116. However, if the output voltage Vout of the power converter 102 rises too much, current through the bridging circuit 116 may become dangerously high. In one embodiment, the control circuitry 108 of the VR controller 100 implements a timer or state machine (SM) 118 for controlling the bridging circuit 116 during the ramp-up procedure of the power converter 102 to avoid excessive current conditions.

Figure 2:
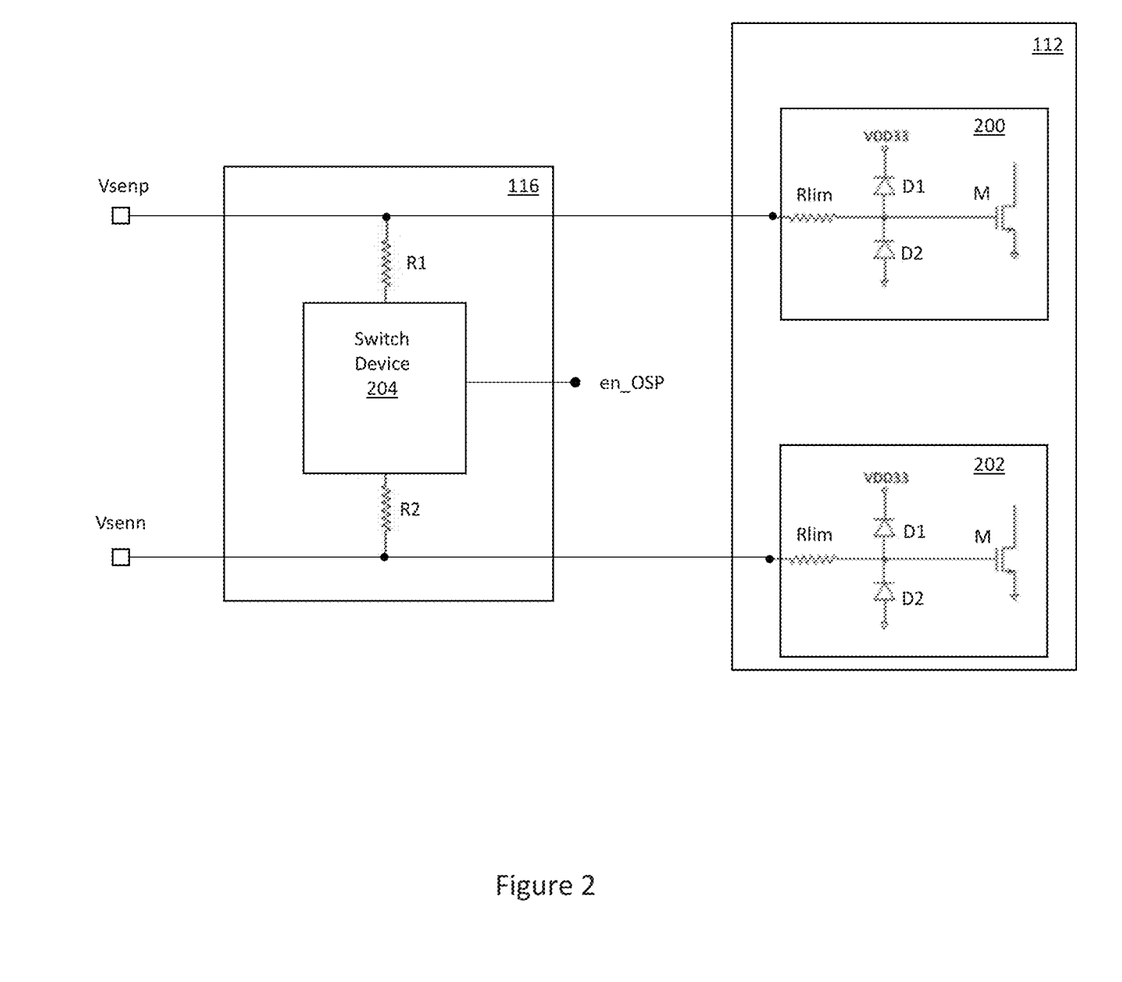
FIG. 2 illustrates a schematic diagram of an embodiment of a bridging circuit included in the power converter controller.

FIG. 2 illustrates an embodiment of the bridging circuit 116. According to this embodiment, the voltage sense circuit 108 of the VR controller 100 includes a first I/O buffer 200 electrically connected to the first voltage sense terminal Vsenp of the VR controller 100 and a second I/O buffer 202 electrically connected to the second voltage sense terminal Vsenn of the VR controller 100. Each I/O buffer 200, 202 may include a current limiting resistor Rlim, diode clamps D1/D2 for clamping the voltage to a certain level 'VDD33' and a driver transistor Q1 such as a MOSFET. The bridging circuit 116 includes a switch device 204, a first resistor R1 electrically connected between the first voltage sense terminal Vsenp of the VR controller 100 and the switch device 204, and a second resistor R2 electrically connected between the second voltage sense terminal Vsenn of the VR controller 100 and the switch device 204. The first resistor R1, the switch device 204 and the second resistor R2 are electrically connected in series between the voltage sense terminals Vsenp, Vsenn of the VR controller 100.

The first resistor R1 forms a first resistor divider with the first I/O buffer 200, and the second resistor R2 forms a second resistor divider with the second I/O buffer 202. In one embodiment, the control circuitry 108 of the VR controller 100 utilizes the resistor dividers to determine whether the voltage across the bridging circuit 116 in the first state rises above a threshold value within a defined time window and thus whether any fault conditions are present on the sensing lines 114 connected to the voltage sense terminals Vsenp, Vsenn of the VR controller 100.

As part of the voltage feedback continuity failure detection technique, the control circuitry 108 of the VR controller 100 provides a signal 'en_osp' which determines the state of the switch device 204. For example, when the signal en_osp is active, e.g., logic high, the switch device 104 electrically couples the first voltage sense terminal Vsenp of the VR controller 100 to the second voltage sense terminal Vsenn of the VR controller 100 and the control circuitry 108 of the VR controller 100 determines whether an open or short fault condition is present at either voltage sense terminal Vsenp, Vsenn based on the voltage across the bridging circuit 116 in this state. When the signal en_osp subsequently goes inactive, e.g., logic low, the switch device 204 electrically decouples the first voltage sense terminal Vsenp from the second voltage sense terminal Vsenn so that the bridging circuit 116 does not interfere with normal operation of the power converter 102.

Figure 3:
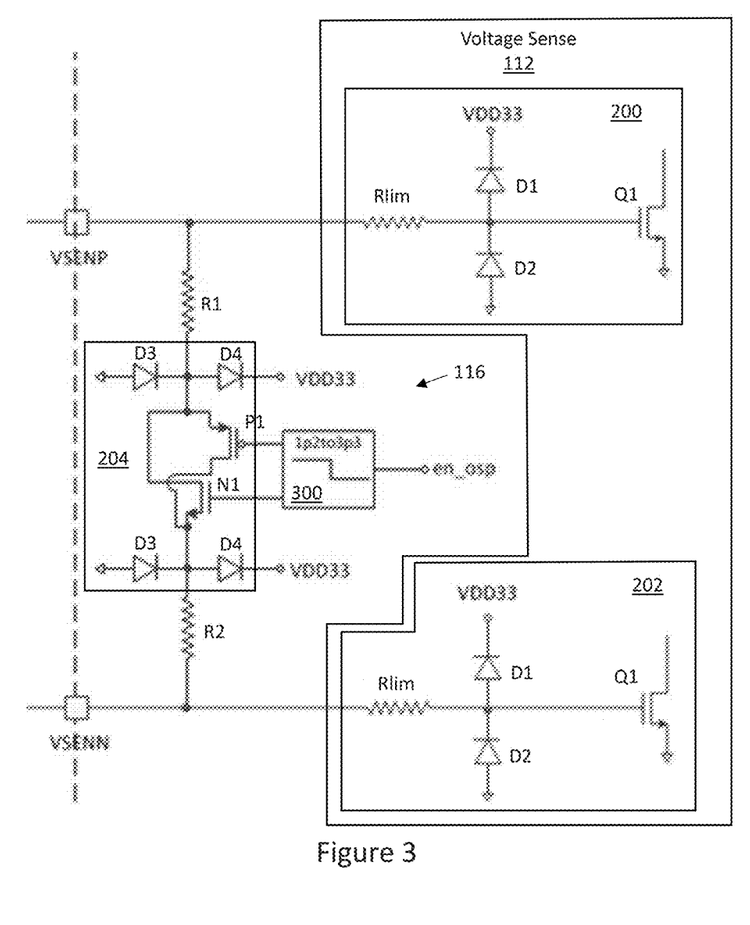
FIG. 3 illustrates a schematic diagram of another embodiment of the bridging circuit.

FIG. 3 illustrates an embodiment of the switch device 204 of the bridging circuit 116. According to this embodiment, the switch device 204 includes a pMOS transistor P1 and an nMOS transistor N1. The switch device 204 may also include a diode clamp D3/D4 between each resistor R1, R2 of the bridging circuit 116 and the corresponding transistor P1, N1 of the switch device 204, to clamp the voltage of the upper and lower legs of the bridging circuit 116 to a certain level 'VDD33'.

The source of the pMOS transistor P1 and the drain of the nMOS transistor N1 are electrically connected to the first resistor R1. The source of the nMOS transistor N1 and the drain of the pMOS transistor P1 are electrically connected to the second resistor R2. According to the embodiment illustrated in FIG. 3, the signal en_OSP generated by the control circuitry 108 of the VR controller 100 is a gate signal applied to the gate of the pMOS transistor P1. An inverted version of the signal en_OSP is applied to the gate of the nMOS transistor N1. This way, both transistors P1, N1 of the switch device 204 are on or off at the same time. When both transistors P1, N1 of the switch device 204 are on, the first voltage sense terminal Vsenp of the VR controller 100 is electrically coupled to the second voltage sense terminal Vsenn of the VR controller 100. Conversely, when both transistors P1, N1 of the switch device 204 are off, the first voltage sense terminal Vsenp of the VR controller 100 is electrically decoupled from the second voltage sense terminal Vsenn of the VR controller 100 by the switch device 204.

In the case of the control circuitry 108 of the VR controller 100 being a digital controller, the bridging circuit 116 may further include a level shifter 300 configured to level shift the signal en_OSP generated by the control circuitry 108 of the VR controller 100 from a lower voltage domain of the control circuitry 108 to a higher voltage domain of the voltage sense terminals Vsenp, Vsenn of the VR controller 100. For example, the level shifter 300 may shift the signal en_OSP from 1.2V ('1p2' in FIG. 3) for the control circuitry 108 of the VR controller 100 to 3.3V ('3p3') for the voltage sense terminals Vsenp, Vsenn of the VR controller 100.

Figure 4:
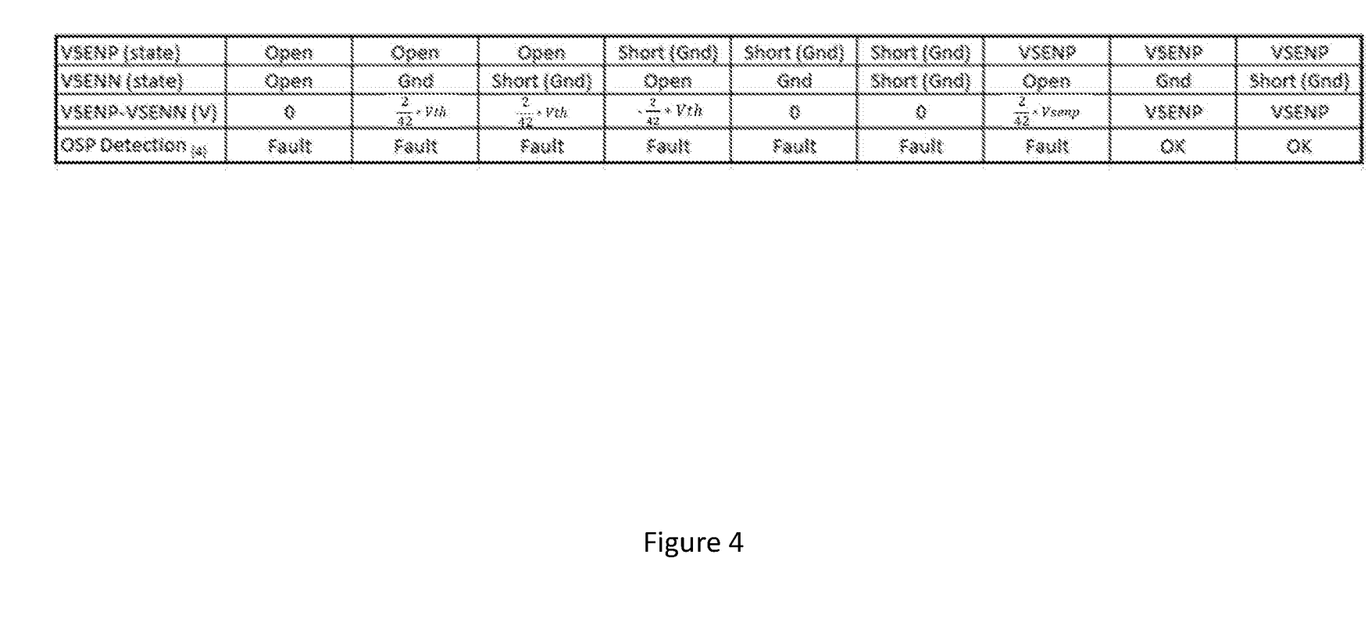
FIG. 4 illustrates a table with different fault conditions which can be detected using the voltage feedback continuity failure detection technique described herein.

FIG. 4 illustrates an embodiment of the faults which can be detected by the VR controller 100, using the voltage feedback continuity failure detection technique described herein. The first row of the table in FIG. 4 shows different possible states detected by the control circuitry 108 of the VR controller 100 at the first voltage sense terminal Vsenp of the VR controller 100. The states include an open fault (Open), a short fault ('Short (Gnd)'), and a normal/expected voltage level in the case of no faults ('VSENP'). The second row of the table in FIG. 4 shows different possible states detected by the control circuitry 108 of the VR controller 100 at the second voltage sense terminal Vsenn of the VR controller 100. The states include an open fault (Open), a short fault ('Short (Gnd)'), and a normal/expected voltage level in the case of no faults ('Gnd'). The normal/expected voltage level at the second voltage sense terminal Vsenn of the VR controller 100 is identified as ground ('Gnd') in FIG. 4 since the voltage sensing line 114 connected to the second voltage sense terminal Vsenn of the VR controller 100 is coupled to ground, according to this embodiment.

The third row of the table in FIG. 4 shows the voltage difference in Volts between the voltage sense terminals Vsenp, Vsenn of the VR controller 100 as measured/sensed by the voltage sense circuit 112 of the VR controller 100 when the voltage sense terminals Vsenp, Vsenn of the VR controller 100 are electrically coupled to one another by the bridging circuit 116 during a first portion of a voltage ramp of the power converter 102. The fourth row of the table in FIG. 4 shows whether the control circuitry 108 of the VR controller 100 generates a fault ('Fault') or no fault ('OK') signal based on the voltage difference measured/sensed by the voltage sense circuit 112 when the voltage sense terminals Vsenp, Vsenn of the VR controller 100 are electrically coupled by the switch device 204 during the first portion of a voltage ramp of the power converter 102.

In one embodiment, the VR controller 100 includes an analog-to-digital converter (ADC) 120 for converting the voltage measured/sensed across the bridging circuit 116 when the voltage sense terminals Vsenp, Vsenn of the VR controller 100 are electrically coupled by the switch device 204 to a digital representation. The digital representation of the voltage measured/sensed across the bridging circuit 116 in this state remains below a threshold value for a defined time window if an open or short fault condition is present at either voltage sense terminal Vsenp, Vsenn of the VR controller 100. The digital representation of the measured/sensed voltage across the bridging circuit 116 rises above the threshold value in this state during the defined time window if no open or short fault condition is present at the first voltage sense terminal Vsenp of the VR controller 100 and the second voltage sense terminal Vsenn of the VR controller 100 is at ground or shorted to ground, since the second voltage sense terminal Vsenn of the VR controller 100 is referenced to ground according to this embodiment.

The states detected by the VR controller and listed in the last row of the table in FIG. 4 are explained in the context of an example in which the current limiting resistors Rlim of the I/O buffers 200, 202 are each 40 KOhm, the branch resistors R1 and R2 of the bridging circuit 116 are each 950 Ohm, the threshold voltage of the driver transistors Q1 of the I/O buffers 200, 202 is 0.7V, and the threshold voltage for detecting a fault condition is 0.25V.

If both sensing lines 114 connected to the voltage sense terminals Vsenp, Vsenn of the VR controller 100 have an open fault (column 2 in FIG. 4), then the voltage measured/sensed across the bridging circuit 116 is 0 V.

If the sensing line 114 connected to the first (positive) voltage sense terminal Vsenp of the VR controller 100 has an open fault and the sensing line 114 connected to the second (reference) voltage sense terminal Vsenp of the VR controller 100 is tied to ground or has a short fault to ground (columns 3 and 4 in FIG. 4), then the voltage measured/sensed across the bridging circuit 116 is $2/42$ Vth where Vth is the threshold voltage.

If the sensing line 114 connected to the first voltage sense terminal Vsenp of the VR controller 100 has a short fault to ground and the sensing line 114 connected to the second voltage sense terminal Vsenp of the VR controller 100 has an open fault (column 5 in FIG. 4), then the voltage measured/sensed across the bridging circuit 116 is $-2/42$ Vth.

If the sensing line 114 connected to the first voltage sense terminal Vsenp of the VR controller 100 has a short fault to ground and the sensing line 114 connected to the second voltage sense terminal Vsenp of the VR controller 100 is tied to ground or has a short fault to ground (columns 6 and 7 in FIG. 4), then the voltage measured/sensed across the bridging circuit 116 is 0 V.

If the sensing line 114 connected to the first voltage sense terminal Vsenp of the VR controller 100 has no fault and the sensing line 114 connected to the second voltage sense terminal Vsenp of the VR controller 100 has an open fault (column 8 in FIG. 4), then the voltage measured/sensed across the bridging circuit 116 is $2/42$ Vsenp.

If the sensing line 114 connected to the first voltage sense terminal Vsenp of the VR controller 100 has no fault and the sensing line 114 connected to the second voltage sense terminal Vsenp of the VR controller 100 is tied to ground or has a short fault to ground (columns 9 and 10 in FIG. 4), then the voltage measured/sensed across the bridging circuit 116 is Vsenp.

Other measured/sensed voltage values are possible for the different fault conditions, depending on the parameters selected for the values selected from the current limiting resistors Rlim of the I/O buffers 200, 202, the branch resistors R1 and R2 of the bridging circuit 116, and the driver transistors Q1 of the I/O buffers 200, 202.

Figure 5:
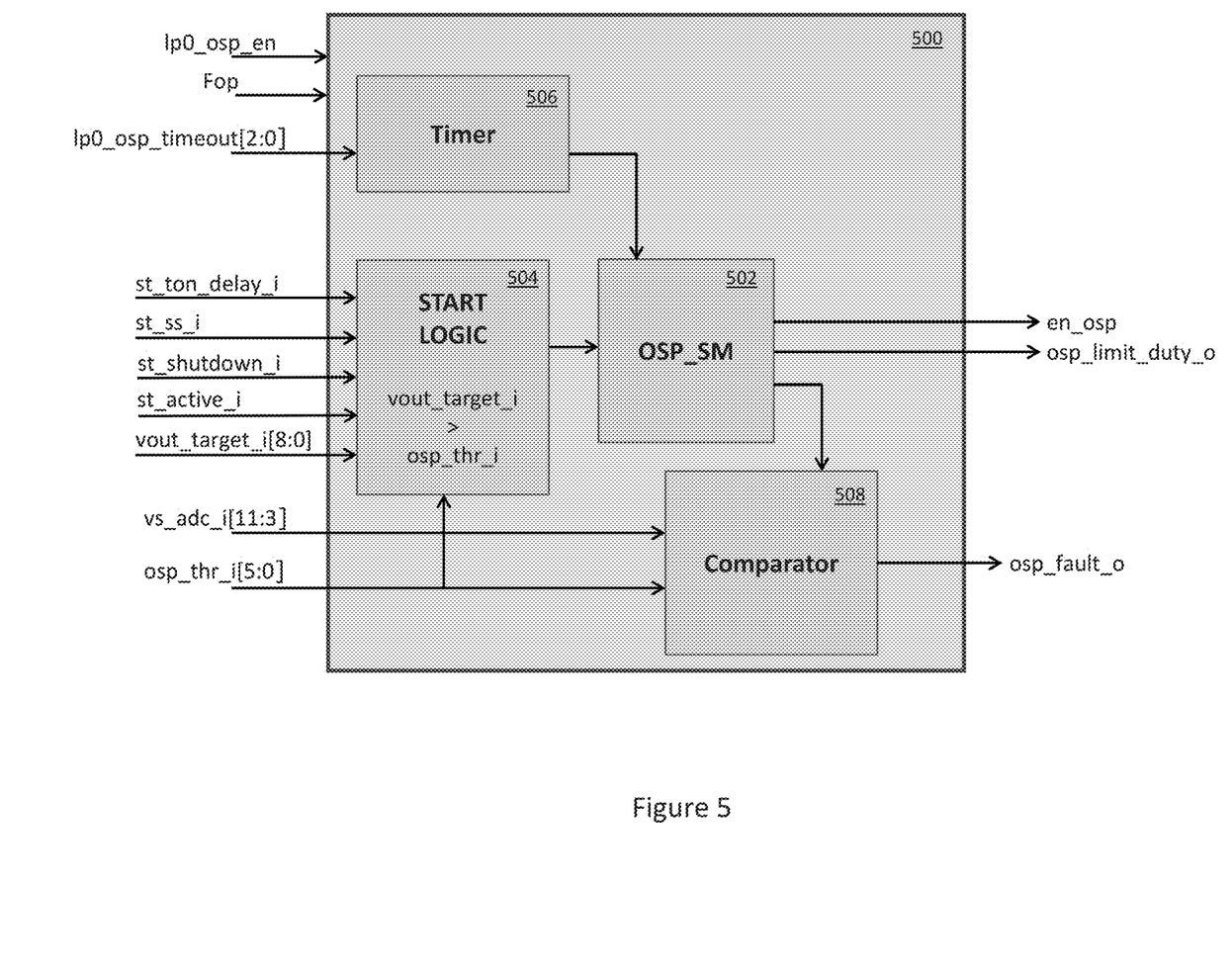
FIG. 5 illustrates a block diagram of an embodiment of a digital controller implementation of the power converter controller.

FIG. 5 illustrates a digital controller embodiment of the control circuitry 108 of the VR controller 100, for implementing the voltage feedback continuity failure detection technique described herein. According to this embodiment, the digital controller 500 includes a state machine (SM) or other logic ('OSP_SM') 502 for implementing the voltage measurement loop, start logic 504 for controlling when the state machine/logic 502 begins the voltage measurement loop, a timer 506 for determining the duration of the voltage measurement loop, and a comparator 508 for detecting a fault condition at either voltage sense terminal Vsenp, Vsenn of the VR controller 100 based on the voltage measurement results.

In one embodiment, the comparator output 'osp_fault_o' indicates a fault condition at one or both of the voltage sensing lines 114 connected to the voltage sense terminals Vsenp, Vsen of the VR controller 100 when the voltage (Vsenp-Vsenn) across the bridging circuit 116 remains below a threshold value over a certain number of measurements at the operating frequency (Fop) of the digital controller 500. For example, the comparator output osp_fault_o may trigger/activate when the bridging circuit voltage remains below the threshold value for 75 measurements at Fop=25 MHz.

A signal 'st_active_i' flags that the power converter 102 is active, meaning operating at the regulated output voltage Vout. One or more additional signals may be provided to the start logic 504 of the digital controller 500. For example, a shutdown signal 'st_shutdown_i' flags that a shutdown event occurred and that the power converter 102 is disabling the output voltage Vout, and is also used to re-initialize the start logic 504. A delay signal 'st_ton_delay_i' is the signal that indicates the power converter 102 received the command to operate, and is waiting the required ton_delay time before starting the output voltage ramp. For example, the regulator output voltage Vout may have an initial bias at the begging of a voltage ramp. The delay signal st_ton_delay_i may be used to ensure that the voltage feedback continuity failure detection technique begins at Vsenn−Vsenp=0V. Otherwise, the voltage measurement loop may begin with a bias, e.g., of 100 mV or more on Vout.

A signal 'vout_target_i[8:0]' may indicate a target profile for the regulator output voltage Vout during a voltage ramp. The target voltage corresponds to the profile Vout is expected to have during a voltage ramp and without any fault conditions on the sensing lines 114 connected to the voltage sense terminals Vsenp, Vsenn of the VR controller 100. The start logic 504 of the digital controller 500 may compare the target voltage signal vout_target_i[8:0] to a threshold signal 'osp_thr_i[5:0]', to determine when the defined time window should begin over which the state machine/logic 502 implements the voltage measurement loop. In one embodiment, the start logic 504 instructs the state machine/logic 502 to begin the voltage measurement loop when the target voltage signal vout_target_i[8:0] exceeds the threshold signal osp_thr_i[5:0]. The target voltage signal vout_target_i[8:0] is depicted as being nine bits in length and the threshold signal osp_thr_i[5:0] as being 6 bits in length. This is just an example. Different bit lengths can be used for either signal.

A signal 'st_ss_i' is used to flag the output voltage ramp state (soft start)power converter. For example, the duty cycle of the power stage 104 may be forced to a lower value than what is used under normal operating conditions when the voltage feedback continuity failure detection technique is not being performed. For example, to avoid dangerous current levels at the load 106, e.g., if the regulator output voltage Vout rises in an undesired way, the signal st_ss_i may be used to that the digital controller 500 outputs a signal 'osp_limit_duty_o' for limiting the PWM duty cycle of the power stage 104 while the voltage feedback continuity failure detection technique is being performed. For example, the PWM duty cycle of the power stage 104 may be limited to a first value, e.g. 12.5%, if the signal osp_limit_duty_o is in a first state and limited to a second value, e.g. 6.25%, if the signal osp_limit_duty_o is in a second state. If there is an open fault and the regulator output current begins to increase abnormally while the voltage feedback continuity failure detection technique is being performed, the load 106 is less likely to be damaged since the PWM duty cycle is limited/restricted according to this embodiment. An enable signal 'lp0_osp_en' may be provided for enabling or disabling the voltage measurement loop implemented by the state machine/logic 502 of the digital controller 500.

The signals st_active_i, st_shutdown_i, st_ton_delay_i, and st_ss_i are used to provide a safe start logic function so as to not to trigger false OSP detections. Some state signals also go to the state machine/logic 502. The output voltage target, which is represented in FIG. 5 by the signal vout_target_i[8:0], is compared with osp_thr only during the initial phase of st_ss_i where Vout is expected to start rising and the power converter 102 is still in a phase where the output voltage Vout could be low enough to prevent catastrophic damages.

A signal 'lp0_osp_timeout[2:0]' indicates the duration of the defined time window over which the state machine/logic 502 of the digital controller 500 implements the voltage measurement loop. In the case of a 3-bit signal as shown in FIG. 5, the duration of the time window may be set to one of 8 different values, e.g., one of 5 µs, 6 µs, 7 µs, 8 µs, 16 µs, 32 µs, 64 µs, and 128 µs. Fewer or more values and different values may be used for the defined time window, by modifying the length and coding of the bit values of the timeout signal lp0_osp_timeout[2:0].

The defined time window over which the state machine/logic 502 of the digital controller 500 implements the voltage measurement loop should be wide enough to detect a fault condition on either voltage sensing line 114 connected to the voltage sense terminals Vsenp, Vsenn of the VR controller 100, but not too wide so that the regulator output voltage Vout becomes dangerously high. In one embodiment, the defined time window is based on the ramp rate of the power converter 102 so that the defined time window is longer for a slower ramp rate and shorter for a faster ramp rate. For example, if the output capacitor Cout of the power converter 102 is relatively large, the regulator 102 will start slowly. For a slow ramp rate, more detection time is needed to detect a fault condition on the voltage sensing lines 114. A wider defined time window may be implemented by setting the timeout signal lp0_osp_timeout accordingly. If the power converter 102 has less output capacitance, the ramp rate is faster and less detection time is needed to identify a problem on the voltage sensing lines 114. A narrower defined time window may be selected by setting the timeout signal lp0_osp_timeout accordingly. The defined time window can be programmable for added system flexibility.

The state machine/logic 502 of the digital controller 500 implements the voltage measurement loop upon activation/enablement by the start logic 504. In response, the state machine/logic 502 sets the signal en_osp to a first value which sets the bridging circuit 116 in the first state. The bridging circuit 116 electrically couples the first voltage sense terminal Vsenp of the VR controller 100 to the second voltage sense terminal Vsenn of the VR controller in the first state, as previously explained herein.

When the defined time window expires, the state machine/logic 502 of the digital controller 500 sets the signal en_osp to a second value which sets the bridging circuit 116 in the second state. The bridging circuit 116 electrically decouples the voltage sense terminals Vsenp, Vsenn of the VR controller 100 in the second state, also as previously explained herein. The timer 506 indicates to the state machine/logic 502 when the defined time window expires, causing the state machine/logic 502 to change the signal en_osp from one value to another value, e.g., from a logic high value to a logic low value or vice-versa, to control the state of the bridging circuit 116.

As previously explained herein, the signal en_osp provided by the state machine/logic 502 of the digital controller 500 is used as a gate signal to control whether the transistors P1, N1 of the bridging circuit switch device 204 are on or off. When the transistors P1, N1 of the switch device 204 are on, the first voltage sense terminal Vsenp of the VR controller 100 is electrically coupled to the second voltage sense terminal Vsenn of the VR controller 100 and the voltage across the bridging circuit 116 begins to rise. The comparator 508 compares a digital or analog representation of the voltage across the bridging circuit 116 to a threshold value defined by the threshold signal osp_thr_i. In the case of a digital representation, the digital controller 500 determines whether an open or short fault condition is present at either voltage sense terminal Vsenp, Vsenn of the VR controller 100 based on a digital representation 'vs_adc_i[11:3]' of the voltage across the bridging circuit 116. For example, the comparator 508 may compare the ADC output vs_adc_i[11:3] to the threshold signal osp_thr_i. The resolution of the ADC may be selected as desired.

The comparator 508 generates a fault indication signal 'osp_fault_o' if the voltage across the bridging circuit 116 remains below the threshold value, e.g., for a certain number of measurements at the operating frequency (Fop) of the digital controller 500. Separately or in addition, the VR controller 100 may shutdown the power converter 102 in response to detecting a fault on either voltage sensing line 114. The defined time window and/or the threshold value used as part of the voltage feedback continuity failure detection technique may be programmable, for added flexibility.

Figure 6:
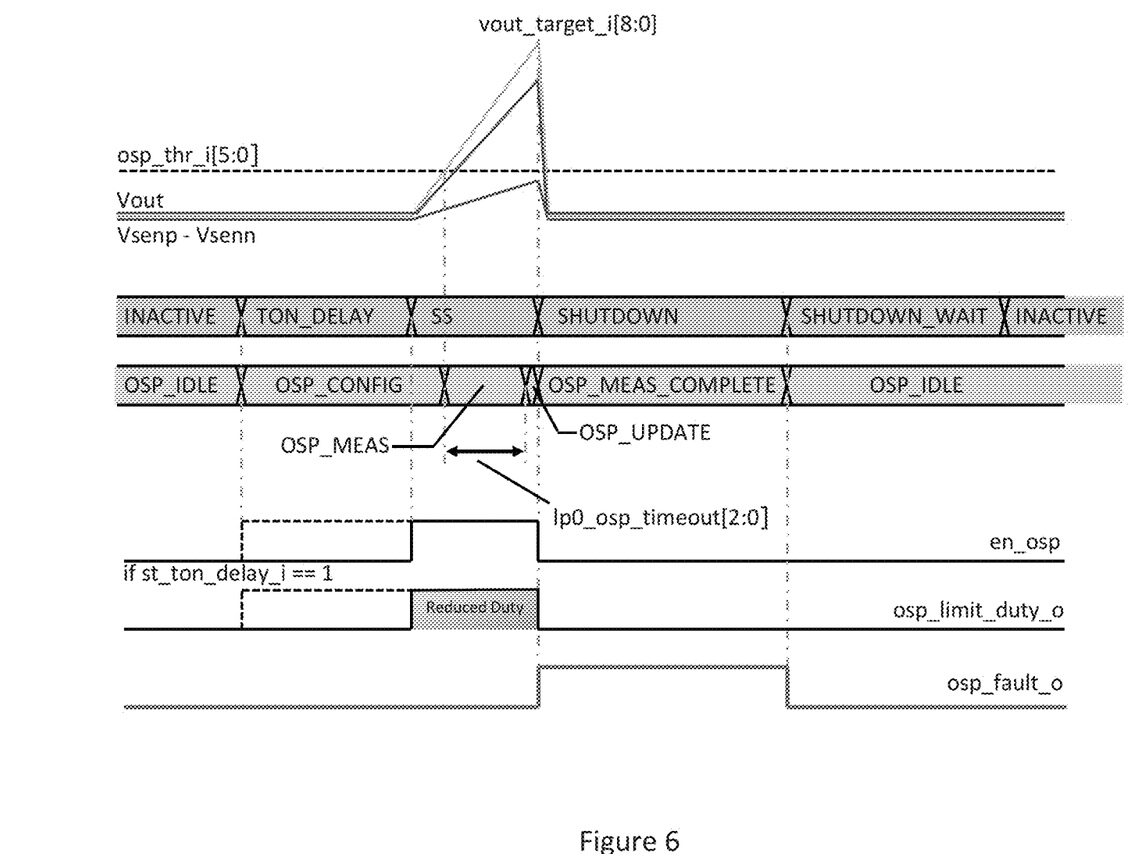
FIG. 6 illustrates various waveforms for an occurrence of the voltage feedback continuity failure detection technique during which a fault is detected.

FIG. 6 illustrates various waveforms for an occurrence of the voltage feedback continuity failure detection technique during which a fault is detected. FIG. 6 plots the actual output voltage Vout of the power converter 102, the target voltage signal vout_target_i[8:0], the threshold signal osp_thr_i[5:0], and the voltage (Vsenp-Vsenn) measured/sensed across the bridging circuit 116 during the voltage measurement loop implemented by the state machine/logic 502 of the digital controller 500. When the power converter 102 is inactive ('INACTIVE' VR state in FIG. 6), the voltage feedback continuity failure detection technique is idle ('OSP_IDLE' digital controller state in FIG. 6).

When the start logic 504 of the digital controller 500 determines that the voltage feedback continuity failure detection technique should be initiated, the state machine/logic 502 of the digital controller 500 sets the signal en_osp to a first value which sets the bridging circuit 116 in a first state. In the first state, the switch device 204 of the bridging circuit 116 electrically couples the first voltage sense terminal Vsenp of the VR controller 100 to the second voltage sense terminal Vsenn of the VR controller 100.

Activation of the signal en_osp may be delayed if the delay signal st_ton_delay_i is active, as indicated by the dashed line portion of the signal en_osp in FIG. 6 ('TON_DELAY' VR state and 'OSP_CONFIG' digital controller state in FIG. 6). The duty cycle of the power converter power stage 104 may be limited/restricted by using the signal osp_limit_duty_o, as previously explained herein ('SS' VR state in FIG. 6). In either case, after the state machine/logic 502 sets the signal en_osp to the first value, the comparator 508 determines when the target voltage signal vout_target_i[8:0] rises above the threshold voltage indicated by the threshold signal osp_thr_i[5:0]. At this point, the state machine/logic 502 begins the voltage measurement loop ('OSP_MEAS' digital controller state in FIG. 6).

In the example shown in FIG. 6, the voltage Vsenp-Vsenn measured/sensed across the bridging circuit 116 via the voltage sense circuit 112 of the VR controller 100 fails to rise above the threshold voltage indicated by the threshold signal osp_thr_i[5:0] during the defined time window indicated by the timeout signal lp0_osp_timeout[2:0] due to a fault on one or both of the sensing lines 114 connected to the voltage sense terminals Vsenp, Vsen of the VR controller 100. At the end of the defined time window, the state machine/logic 502 stops the voltage measurement loop by changing the signal en_osp to a second value which sets the bridging circuit 116 in a second state ('OSP_MEAS_COMPLETE' digital controller state in FIG. 6). In the second state, the switch device 204 of the bridging circuit 116 electrically decouples the voltage sense terminals Vsenp, Vsenn of the VR controller 100. The VR controller 100 may perform a fault detection update at the end of the defined time window ('OSP_UPDATE' digital controller state in FIG. 6). The result of the OSP sense operation is carried over when the state machine/logic 502 enters an OSP update state ('OSP_UPDATE' digital controller state in FIG. 6), to avoid glitches or temporary results on the fault signal.

In response to the voltage Vsenp-Vsenn failing to rise above the threshold voltage by the end of the defined time window, the comparator 508 of the digital controller 500 generates the fault indication signal osp_fault_o to indicate a fault has occurred on one or both of the sensing lines 114 connected to the voltage sense terminal Vsenp, Vsenn of the VR controller 100. The power converter 102 may also shutdown as a precaution ('SHUTDOWN' VR state in FIG. 6). The power converter 102 may enter a wait period before attempting to reinitiate the voltage feedback continuity failure detection technique, e.g., to determine whether the sensing line fault has cleared ('SHUTDOWN_WAIT' VR state in FIG. 6). The digital controller 500 that implements the voltage feedback continuity failure detection technique remains idle during the wait period ('OSP_IDLE' digital controller state in FIG. 6).

Figure 7:
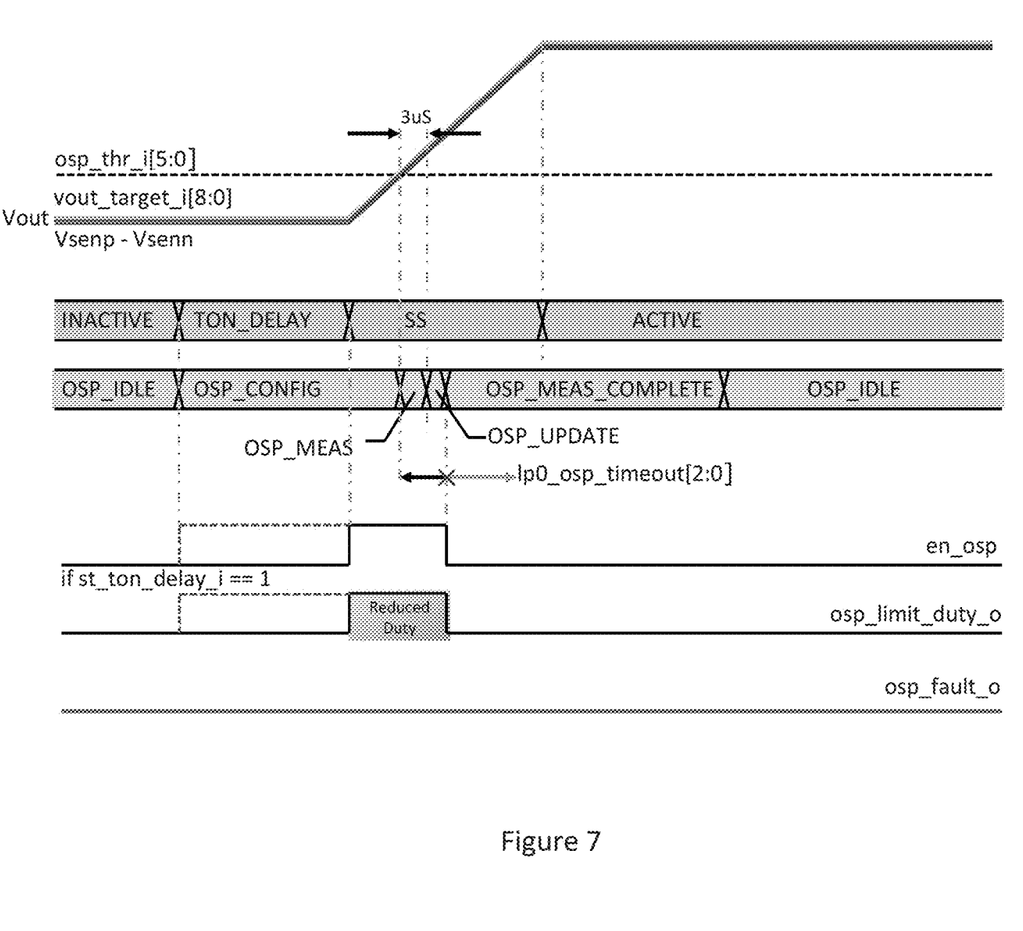
FIG. 7 illustrates various waveforms for an occurrence of the voltage feedback continuity failure detection technique during which no fault is detected.

FIG. 7 illustrates the same waveforms as FIG. 6, but for an occurrence of the voltage feedback continuity failure detection technique during which no fault is detected. Unlike in FIG. 6, the voltage Vsenp-Vsenn measured/sensed across the bridging circuit 116 via the voltage sense circuit 112 rises above the threshold voltage indicated by the threshold signal osp_thr_i[5:0] during the defined time window indicated by the timeout signal lp0_osp_timeout[2:0] and remains above the threshold voltage for a predetermined duration, e.g., 3 μs as shown in FIG. 7. Hence, no fault is detected on either sensing line 114 connected to the voltage sense terminals Vsenp, Vsenn of the VR controller 100. The VR controller 100 may perform the fault detection update routine after the voltage Vsenp-Vsenn remains above the threshold voltage for the predetermined duration ('OSP_UPDATE' digital controller state in FIG. 6). When the output voltage Vout of the regulator 102 reaches the target voltage indicated by vout_target_i[8:0], the VR controller 100 may enter normal regulation ('ACTIVE' VR state in FIG. 7). This may include lifting any restriction on the duty cycle of the power converter power stage 104 implemented as part of the voltage feedback continuity failure detection technique.

Figure 8:
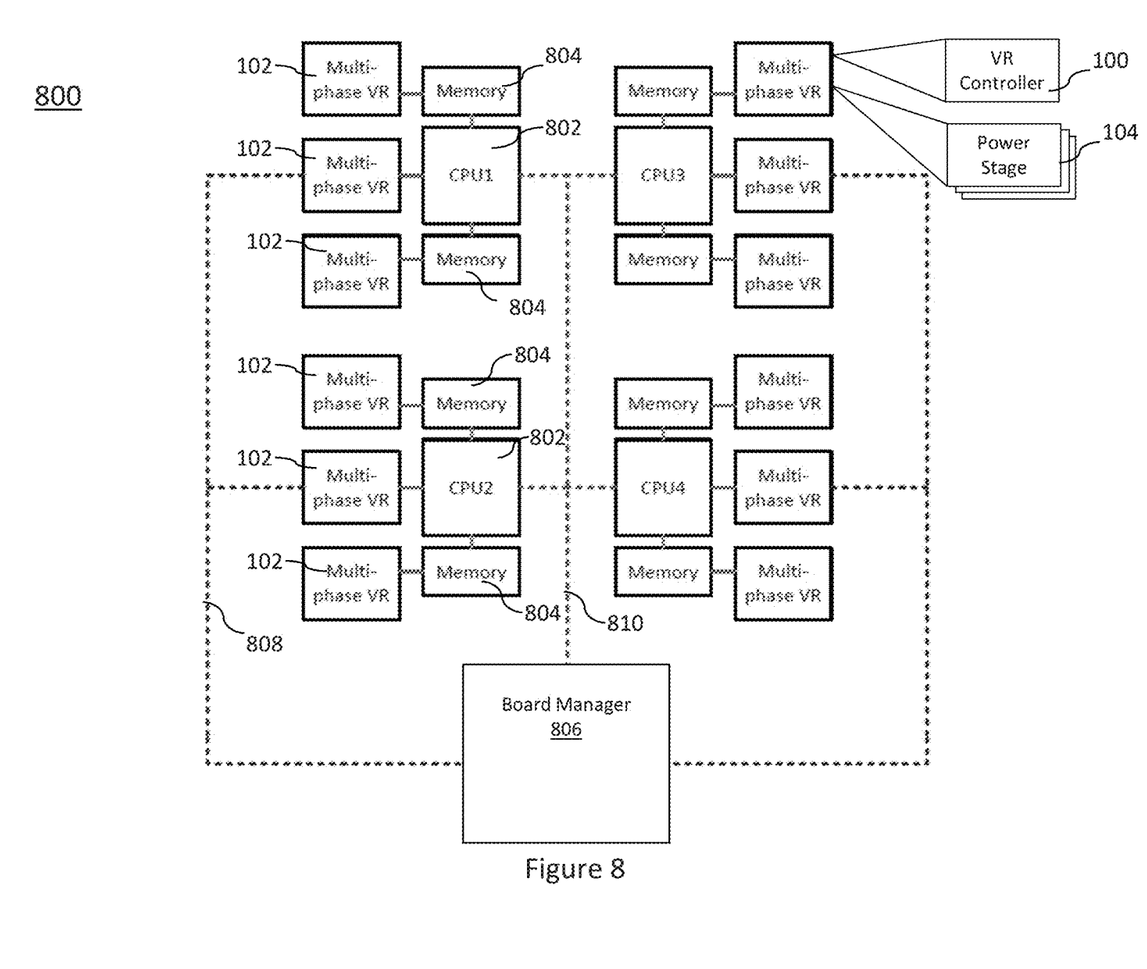
FIG. 8 illustrates a block diagram of an embodiment of an electronic system that includes one or more of the power converters shown in FIG. 1.

FIG. 8 illustrates an embodiment of an electronic system 800 that includes one or more of the power converters 102 previously described herein. The electronic system 800 may be, e.g., a system board such as a server board. The electronic system 800 may also include one or more microprocessors (e.g., CPUs) 802 and at least one memory 804 associated with each microprocessor 802. Each power converter 102 may regulate one or more voltages applied to one or more of the microprocessors 802 and associated memory 804. For example, one or more power converters 102 may be a multiphase power converter that includes two or more power stages 104. In the case of a multiphase buck converter, each power stage 104 of the multiphase buck converter 102 includes a high-side transistor and a low-side transistor for coupling that phase to a corresponding one of the microprocessors 802 through an inductor.

As the power demand for a microprocessor 802 changes, the corresponding power converter 102 may dynamically activate or deactivate power stages 104. Furthermore, at periods of low microprocessor usage, the corresponding power converter 102 may select a subset of the power stages 104 and deactivate the other power stage(s) 104. This is commonly referred to as phase shedding. Each power converter 102 also includes a controller 100 for managing operation of the respective power converter 102, including implementation of the voltage feedback continuity failure detection technique described herein. The power converters 102 are logically illustrated as single units in FIG. 8, but may be implemented as a collection of separate components such as power transistor dies, controller dies, capacitors, inductors, etc.

In the case of a system board such as a server board, the electronic system 800 may also include a board manager 806 that communicates with each microprocessor 802, each memory 804, and each power converter 102. To this end, the electronic system 800 may include a first communication link 808 between the board manager 806 and each power converter 102, and a second communication 810 link between the board manager 806 and each microprocessor 802. The communication links 808, 810 may be implemented as a serial or parallel bus, for example, and the communication links 808, 810 may be independent from one another. Each power converter 102 may communicate the fault information described herein over the corresponding communication link 808.

Although the present disclosure is not so limited, the following numbered examples demonstrate one or more aspects of the disclosure.

Example 1

A controller for a power converter, the controller comprising: a first sense terminal and a second sense terminal for sensing an output voltage of the power converter; a bridging circuit configured to electrically couple the first sense terminal to the second sense terminal in a first state and electrically decouple the first sense terminal from the second sense terminal in a second state; and control circuitry configured to set the bridging circuit in the first state during a portion of a voltage ramp of the power converter, and to determine whether an open or short fault condition is present at either the first sense terminal or the second sense terminal based on a voltage across the bridging circuit in the first state.

Example 2

The controller of example 1, further comprising: a first I/O buffer electrically connected to the first sense terminal; and a second I/O buffer electrically connected to the second sense terminal, wherein the bridging circuit comprises a switch device, a first resistor electrically connected between the first sense terminal and the switch device, and a second resistor electrically connected between the second sense terminal and the switch device, so that the first resistor, the switch device and the second resistor are electrically connected in series between the first sense terminal and the second sense terminal, wherein the first resistor forms a first resistor divider with the first I/O buffer, wherein the second resistor forms a second resistor divider with the second I/O buffer.

Example 3

The controller of example 2, further comprising an analog-to-digital converter configured to convert the voltage across the bridging circuit in the first state to a digital representation which is below a threshold value if an open or short fault condition is present at either the first sense terminal or the second sense terminal and above the threshold value if no open or short fault condition is present at the first sense terminal and the second sense terminal is at ground or shorted to ground.

Example 4

The controller of example 2 or 3, wherein the switch device comprises a pMOS transistor and an nMOS transistor, wherein a source of the pMOS transistor and a drain of the nMOS transistor are electrically connected to the first resistor, and wherein a source of the nMOS transistor and a drain of the pMOS transistor are electrically connected to the second resistor.

Example 5

The controller of any of examples 2 through 4, wherein the control circuitry is a digital controller, and wherein the bridging circuit further comprises a level shifter configured to level shift a gate signal generated by the digital controller for the switch device from a lower voltage domain of the digital controller to a higher voltage domain of the first sense terminal and the second sense terminal.

Example 6

The controller of any of examples 1 through 5, wherein the control circuitry is configured to set the bridging circuit in the first state for a defined time window during a portion of the voltage ramp and set the bridging circuit in the second state after the defined time window expires.

Example 7

The controller of example 6, wherein the control circuitry is configured to generate a fault indication signal and/or shutdown the power converter if the voltage across the bridging circuit is below a threshold value at the end of the defined time window.

Example 8

The controller of example 6 or 7, wherein the defined time window is based on a ramp rate of the power converter so that the defined time window is longer for a slower ramp rate and shorter for a faster ramp rate.

Example 9

The controller of any of examples 6 through 8, wherein the defined time window and/or the threshold value are programmable.

Example 10

The controller of any of examples 6 through 9, wherein the control circuitry is configured to limit a duty cycle of the power converter during the defined time window and end the duty cycle limit after the defined time window expires.

Example 11

The controller of any of examples 6 through 10, wherein the control circuitry is configured to limit the duty cycle to 12.5% or 6.25% during the defined time window.

Example 12

The controller of any of examples 1 through 11, wherein the control circuitry comprises a comparator configured to compare a digital or analog representation of the voltage across the bridging circuit in the first state to a threshold value, and wherein the control circuitry is configured to generate a fault indication signal and/or shutdown the power converter if an output of the comparator is below the threshold value.

Example 13

The controller of any of examples 1 through 12, further comprising an analog-to-digital converter configured to convert the voltage across the bridging circuit in the first state to a digital representation, and wherein the control circuitry is a digital controller configured to determine whether an open or short fault condition is present at either the first sense terminal or the second sense terminal based on the digital representation of the voltage across the bridging circuit in the first state.

Example 14

A method of operating a controller for a power converter, the method comprising: sensing, across a first sense terminal and a second sense terminal of the controller, an output voltage of the power converter; setting a bridging circuit of the controller in a first state during a portion of a voltage ramp of the power converter, to electrically couple the first sense terminal to the second sense terminal; setting the bridging circuit in a second state during a later portion of the voltage ramp, to electrically decouple the first sense terminal from the second sense terminal; and determining whether an open or short fault condition is present at either the first sense terminal or the second sense terminal based on the voltage across the bridging circuit in the first state.

Example 15

The method of example 14, wherein setting the bridging circuit in the first state comprises setting the bridging circuit in the first state for a defined time window during a portion of the voltage ramp, and wherein setting the bridging circuit in the second state comprises setting the bridging circuit in the second state after the defined time window expires.

Example 16

The method of example 15, further comprising generating a fault indication signal and/or shutting down the power converter if the voltage across the bridging circuit is below a threshold value at the end of the defined time window.

Example 17

The method of example 15 or 16, further comprising: limiting a duty cycle of the power converter during the defined time window; and ending the duty cycle limit after the defined time window expires.

Example 18

An electronic system, comprising: a microprocessor; memory coupled to the microprocessor; a power converter configured to regulate a supply voltage of the microprocessor; and a controller for the power converter. The controller comprises: a first sense terminal and a second sense terminal for sensing the supply voltage; a bridging circuit configured to electrically couple the first sense terminal to the second sense terminal in a first state and electrically decouple the first sense terminal from the second sense terminal in a second state; and control circuitry configured to set the bridging circuit in the first state during a portion of a voltage ramp of the power converter, and to determine whether an open or short fault condition is present at either the first sense terminal or the second sense terminal based on a voltage across the bridging circuit in the first state.

Example 19

The electronic system of example 18, wherein the control circuitry is configured to set the bridging circuit in the first state for a defined time window during a portion of the voltage ramp and set the bridging circuit in the second state after the defined time window expires.

Example 20

The electronic system of example 19, wherein the control circuitry is configured to generate a fault indication signal and/or shutdown the power converter if the voltage across the bridging circuit is below a threshold value at the end of the defined time window.

Example 21

The electronic system of example 19 or 20, wherein the defined time window is based on a ramp rate of the power converter so that the defined time window is longer for a slower ramp rate and shorter for a faster ramp rate.

Example 22

The electronic system of any of examples 19 through 21, wherein the control circuitry is configured to limit a duty cycle of the power converter during the defined time window and end the duty cycle limit after the defined time window expires.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A controller for a power converter, the controller comprising:
   a first sense terminal and a second sense terminal for sensing an output voltage of the power converter;
   a bridging circuit configured to electrically couple the first sense terminal to the second sense terminal in a first state and electrically decouple the first sense terminal from the second sense terminal in a second state; and
   control circuitry configured to set the bridging circuit in the first state during a portion of a voltage ramp of the power converter, and to determine whether an open or short fault condition is present at either the first sense terminal or the second sense terminal based on a voltage across the bridging circuit in the first state.

2. The controller of claim 1, further comprising:
   a first I/O buffer electrically connected to the first sense terminal; and
   a second I/O buffer electrically connected to the second sense terminal,
   wherein the bridging circuit comprises a switch device, a first resistor electrically connected between the first sense terminal and the switch device, and a second resistor electrically connected between the second sense terminal and the switch device, so that the first resistor, the switch device and the second resistor are electrically connected in series between the first sense terminal and the second sense terminal,
   wherein the first resistor forms a first resistor divider with the first I/O buffer,
   wherein the second resistor forms a second resistor divider with the second I/O buffer.

3. The controller of claim 2, further comprising an analog-to-digital converter configured to convert the voltage across the bridging circuit in the first state to a digital representation which is below a threshold value if an open or short fault condition is present at either the first sense terminal or the second sense terminal and above the threshold value if no open or short fault condition is present at the first sense terminal and the second sense terminal is at ground or shorted to ground.

4. The controller of claim 2, wherein the switch device comprises a pMOS transistor and an nMOS transistor, wherein a source of the pMOS transistor and a drain of the nMOS transistor are electrically connected to the first resistor, and wherein a source of the nMOS transistor and a drain of the pMOS transistor are electrically connected to the second resistor.

5. The controller of claim 2, wherein the control circuitry is a digital controller, and wherein the bridging circuit further comprises a level shifter configured to level shift a gate signal generated by the digital controller for the switch device from a lower voltage domain of the digital controller to a higher voltage domain of the first sense terminal and the second sense terminal.

6. The controller of claim 1, wherein the control circuitry is configured to set the bridging circuit in the first state for a defined time window during a portion of the voltage ramp and set the bridging circuit in the second state after the defined time window expires.

7. The controller of claim 6, wherein the control circuitry is configured to generate a fault indication signal and/or shutdown the power converter if the voltage across the bridging circuit is below a threshold value at the end of the defined time window.

8. The controller of claim 6, wherein the defined time window is based on a ramp rate of the power converter so that the defined time window is longer for a slower ramp rate and shorter for a faster ramp rate.

9. The controller of claim 6, wherein the defined time window and/or the threshold value are programmable.

10. The controller of claim 6, wherein the control circuitry is configured to limit a duty cycle of the power converter during the defined time window and end the duty cycle limit after the defined time window expires.

11. The controller of claim 6, wherein the control circuitry is configured to limit the duty cycle to 12.5% or 6.25% during the defined time window.

12. The controller of claim 1, wherein the control circuitry comprises a comparator configured to compare a digital or analog representation of the voltage across the bridging circuit in the first state to a threshold value, and wherein the control circuitry is configured to generate a fault indication signal and/or shutdown the power converter if an output of the comparator is below the threshold value.

13. The controller of claim 1, further comprising an analog-to-digital converter configured to convert the voltage across the bridging circuit in the first state to a digital representation, and wherein the control circuitry is a digital controller configured to determine whether an open or short fault condition is present at either the first sense terminal or the second sense terminal based on the digital representation of the voltage across the bridging circuit in the first state.

14. A method of operating a controller for a power converter, the method comprising:
sensing, across a first sense terminal and a second sense terminal of the controller, an output voltage of the power converter;
setting a bridging circuit of the controller in a first state during a portion of a voltage ramp of the power converter, to electrically couple the first sense terminal to the second sense terminal;
setting the bridging circuit in a second state during a later portion of the voltage ramp, to electrically decouple the first sense terminal from the second sense terminal; and
determining whether an open or short fault condition is present at either the first sense terminal or the second sense terminal based on the voltage across the bridging circuit in the first state.

15. The method of claim 14, wherein setting the bridging circuit in the first state comprises setting the bridging circuit in the first state for a defined time window during a portion of the voltage ramp, and wherein setting the bridging circuit in the second state comprises setting the bridging circuit in the second state after the defined time window expires.

16. The method of claim 15, further comprising:
generating a fault indication signal and/or shutting down the power converter if the voltage across the bridging circuit is below a threshold value at the end of the defined time window.

17. The method of claim 15, further comprising:
limiting a duty cycle of the power converter during the defined time window; and
ending the duty cycle limit after the defined time window expires.

18. An electronic system, comprising:
a microprocessor;
memory coupled to the microprocessor;
a power converter configured to regulate a supply voltage of the microprocessor; and
a controller for the power converter, the controller comprising:
a first sense terminal and a second sense terminal for sensing the supply voltage;
a bridging circuit configured to electrically couple the first sense terminal to the second sense terminal in a first state and electrically decouple the first sense terminal from the second sense terminal in a second state; and
control circuitry configured to set the bridging circuit in the first state during a portion of a voltage ramp of the power converter, and to determine whether an open or short fault condition is present at either the first sense terminal or the second sense terminal based on a voltage across the bridging circuit in the first state.

19. The electronic system of claim 18, wherein the control circuitry is configured to set the bridging circuit in the first state for a defined time window during a portion of the voltage ramp and set the bridging circuit in the second state after the defined time window expires.

20. The electronic system of claim 19, wherein the control circuitry is configured to generate a fault indication signal and/or shutdown the power converter if the voltage across the bridging circuit is below a threshold value at the end of the defined time window.

21. The electronic system of claim 19, wherein the defined time window is based on a ramp rate of the power converter so that the defined time window is longer for a slower ramp rate and shorter for a faster ramp rate.

22. The electronic system of claim 19, wherein the control circuitry is configured to limit a duty cycle of the power converter during the defined time window and end the duty cycle limit after the defined time window expires.

* * * * *